United States Patent
Cho et al.

(10) Patent No.: US 9,929,061 B2
(45) Date of Patent: Mar. 27, 2018

(54) MOUNTING APPARATUS

(71) Applicant: Samsung Electronics Co., Ltd., Suwon-si, Gyeonggi-do (KR)

(72) Inventors: Young-Min Cho, Cheonan-si (KR); Changho Lee, Asan-si (KR); Ilhyoung Koo, Asan-si (KR); Baeki Lee, Cheonan-si (KR); Jongkeun Jeon, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 595 days.

(21) Appl. No.: 14/311,235

(22) Filed: Jun. 20, 2014

(65) Prior Publication Data
US 2015/0089801 A1 Apr. 2, 2015

(30) Foreign Application Priority Data
Oct. 2, 2013 (KR) .................. 10-2013-0117847

(51) Int. Cl.
H05K 13/04 (2006.01)
H01L 21/66 (2006.01)
H05K 13/08 (2006.01)

(52) U.S. Cl.
CPC ......... *H01L 22/10* (2013.01); *H05K 13/0417* (2013.01); *H05K 13/08* (2013.01); *Y10T 29/53022* (2015.01)

(58) Field of Classification Search
CPC ...... H05R 13/02; H05R 13/022; H05R 13/04; H05R 13/0404; H05R 13/0408
See application file for complete search history.

(56) References Cited

U.S. PATENT DOCUMENTS

| | | | |
|---|---|---|---|
| 4,571,685 A * | 2/1986 | Kamoshida | H01L 21/67213 257/E21.521 |
| 5,635,832 A * | 6/1997 | Ito | G01R 1/0433 324/72.5 |
| 6,294,747 B1 | 9/2001 | Liu et al. | |
| 2003/0059957 A1 | 3/2003 | Newman | |
| 2011/0215828 A1 | 9/2011 | Kim et al. | |

FOREIGN PATENT DOCUMENTS

| | | | |
|---|---|---|---|
| JP | 6244598 A | * | 9/1994 |
| JP | 3350441 B2 | * | 11/2002 |
| JP | 2003124686 A | * | 4/2003 |
| JP | 2007298498 A | | 11/2007 |
| JP | 2010107405 A | | 5/2010 |
| KR | 100375983 B1 | | 3/2003 |
| KR | 20030072698 A | | 9/2003 |
| KR | 101112621 B1 | | 2/2012 |

* cited by examiner

*Primary Examiner* — Carl Arbes
(74) *Attorney, Agent, or Firm* — Renaissance IP Law Group LLP

(57) ABSTRACT

A mounting apparatus is provided which includes a frame having a table, a support member disposed on the table to support a substrate, and a feeder mounted on a feeder mount unit disposed in the frame at one side of the table. The feeder provides an element to be attached to the substrate. An element value measuring unit is disposed adjacent one side of the frame and directly measures an element value of the element. A head unit picks up the element from the feeder, inputs the element into the element value measuring unit, and/or attaches the element to the substrate. A control device controls operations of the feeder and the head unit.

19 Claims, 12 Drawing Sheets

MOUNTING APPARATUS

CROSS-REFERENCE TO RELATED APPLICATIONS

This U.S. non-provisional patent application claims priority under 35 U.S.C. § 119 from Korean Patent Application No. 10-2013-0117847, filed on Oct. 2, 2013, the contents of which are hereby incorporated by reference in their entirety.

BACKGROUND

The present disclosure relates to a mounting apparatus for mounting an element on a substrate.

A plurality of elements may be attached to a substrate to produce a semiconductor device. Elements attached to the substrate may, for example, be an active element or a passive element. The substrate used to produce a semiconductor device may be a printed circuit board (PCB). In semiconductor devices, elements need to be attached to predetermined positions of the substrate based upon the PCB design information. As semiconductor devices become more highly integrated and miniaturized, or as elements to be attached to the substrate become miniaturized, a process of attaching elements to the substrate may need to be performed by one or more mounting apparatuses.

Elements supplied to mounting apparatuses may be of different types (for instance, resistors, inductors, capacitors, etc.) and values. Mounting apparatuses need to be capable of being operated to allow such elements to be attached to the predetermined positions of the substrate according to the design information.

SUMMARY

The present inventive concepts provide a mounting apparatus for efficiently mounting an element on a substrate.

More particularly, some embodiments of the inventive concepts provide mounting apparatuses that may include a frame having a table. A support member may be disposed on the table to support a substrate. A feeder may be mounted on a feeder mount unit, disposed in the frame at one side of the table, the feeder providing an element to be attached to the substrate. An element value measuring unit may be provided to directly measure a value of the element, the element value measuring unit being disposed at one side of the frame. A head unit may also be provided to pick up the element from the feeder, to input the element into the element value measuring unit, or to attach the element to the substrate. A control device may, for example, control operations of the feeder and the head unit.

BRIEF DESCRIPTION OF THE DRAWINGS

The accompanying drawings are included to provide a better understanding of the inventive concepts, and are incorporated in, and constitute a part of, this specification. The drawings illustrate exemplary embodiments of the inventive concepts and, together with the written description, serve to explain principles of the inventive concepts in detail. In the drawings.

DETAILED DESCRIPTION OF THE EMBODIMENTS

Figure 1:
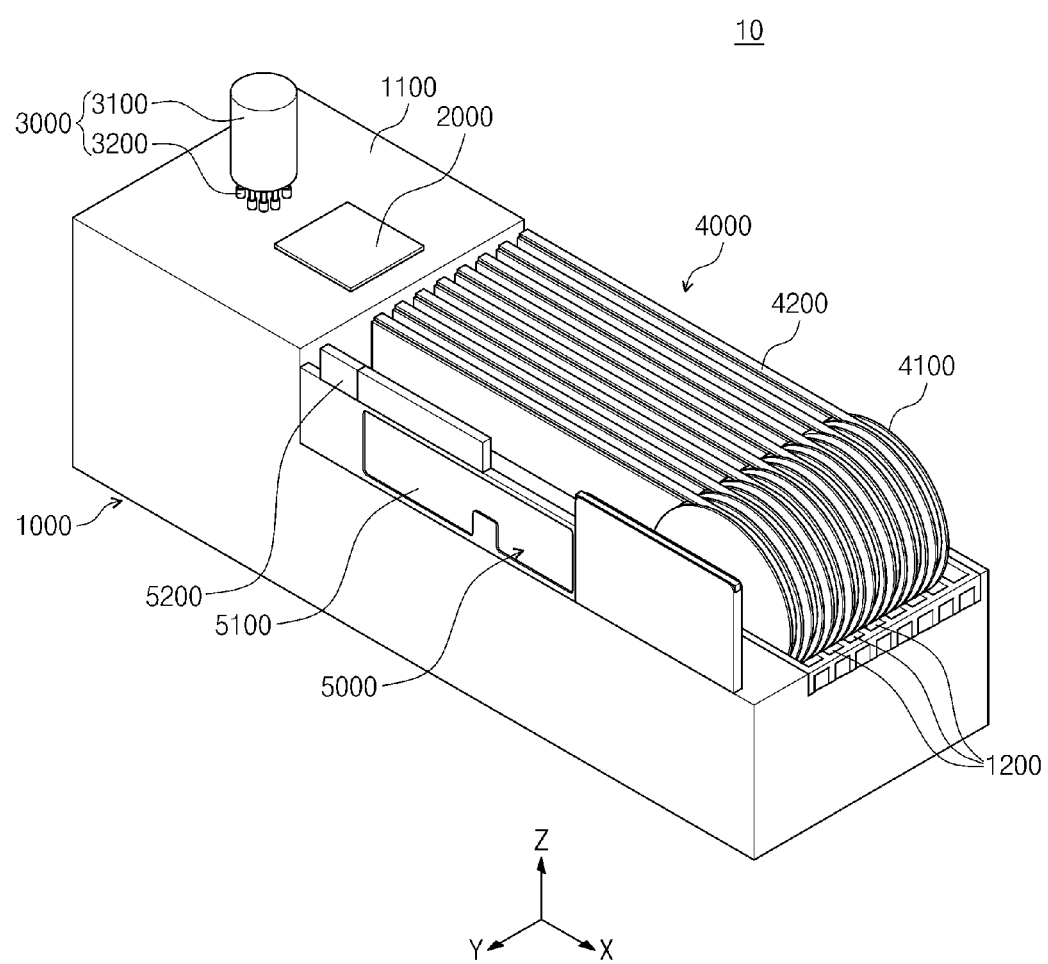
FIG. 1 is a perspective view of a mounting apparatus according to an embodiment of the inventive concepts.

Exemplary embodiments of the inventive concepts will be described below in more detail with reference to the accompanying drawings. The inventive concepts may, however, be embodied in different forms and should not be construed as being limited to the particular embodiments set forth herein. Rather, these embodiments are provided so that this disclosure will be thorough and complete, and will fully convey the scope of the inventive concepts to those skilled in the art. In the drawings, the shapes and sizes of elements may be exaggerated for clarity.

Figure 2:
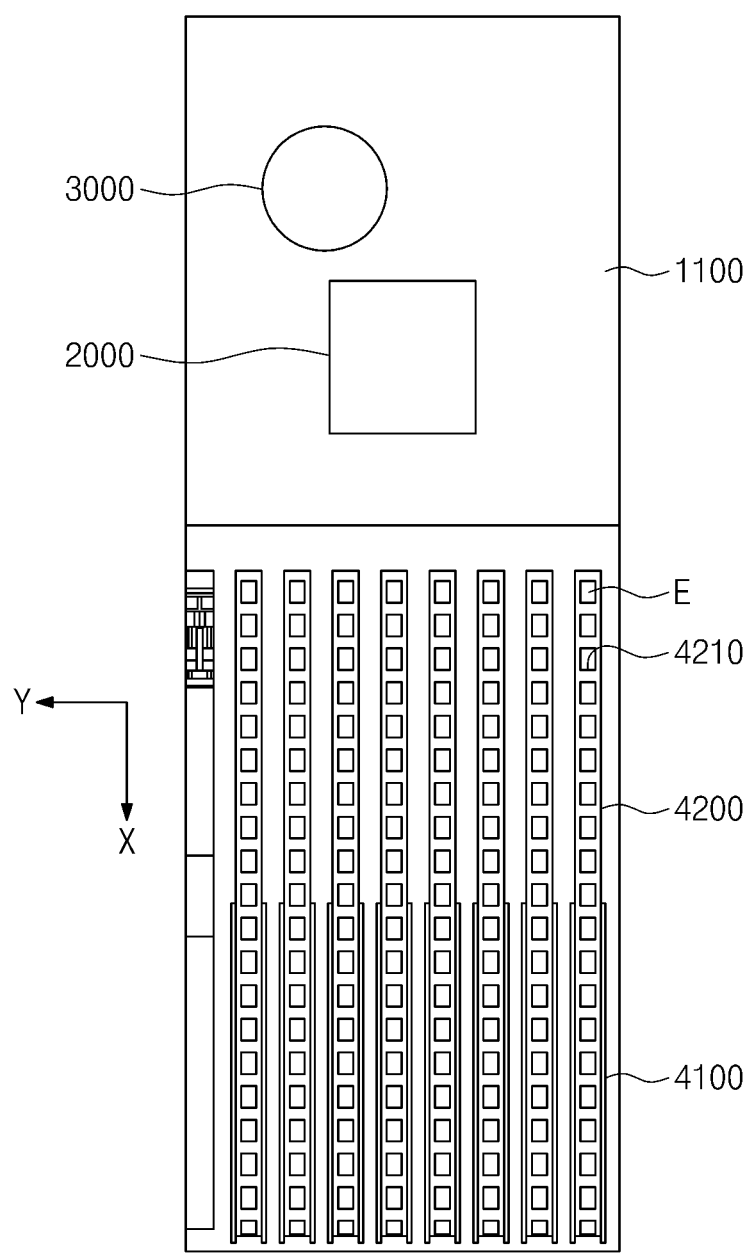
FIG. 2 is a plan view of the mounting apparatus of FIG. 1.

FIG. 1 is a perspective view of a mounting apparatus according to an embodiment of the inventive concepts, and FIG. 2 is a plan view illustrating the mounting apparatus of FIG. 1.

Referring to FIG. 1, a mounting apparatus 10 may include a frame 1000, a support member 2000, a head unit 3000, a feeder 4000, and an element value measuring unit 5000. A control device 6000 (see FIG. 5) may also be provided.

The mounting apparatus 10 may be used to produce a semiconductor device. The semiconductor device produced by the mounting apparatus 10 may, for example, be a memory module or a solid state drive (SSD) module, or the like. One or more elements E (see FIG. 4) may be attached to a substrate to produce the semiconductor device. The elements E may, for instance, be an active element or a passive element. The mounting apparatus 10 may attach the active or the passive element E to a predetermined position on the substrate. The substrate used to produce the semiconductor device may be provided in the form of a printed circuit board (PCB).

Hereinafter, as indicated by the axes shown in the drawings, a direction in which the feeder 4000 is arranged with respect to the frame 1000 may be defined as a first direction X. When viewed from the top, a direction perpendicular to the first direction X may be defined as a second direction Y, and a direction perpendicular to both the first and second directions X and Y may be defined as a third direction Z.

The frame 1000 provides the basic framework for the mounting apparatus 10. The frame 1000 may include a table 1100 or other support surface and at least one feeder mount unit 1200. The table 1100 provides a support surface and work space in which the element E may be attached to the substrate. The feeder mount unit 1200 may be disposed on a side of the table 1100 to supply elements E to the table 1100.

The support member 2000 can support the substrate on which a process of attaching the element E is performed. The support member 2000 may, for example, be disposed on a top surface of the table 1100. The support member 2000 may further be movably disposed on the top surface of the table 1100. For example, the support member 2000 may be moveable in the first direction X, the second direction Y, or the first and second directions X and Y. The support member 2000 may, however, be rigidly fixed to the table 1100 in the Z direction.

Figure 3:
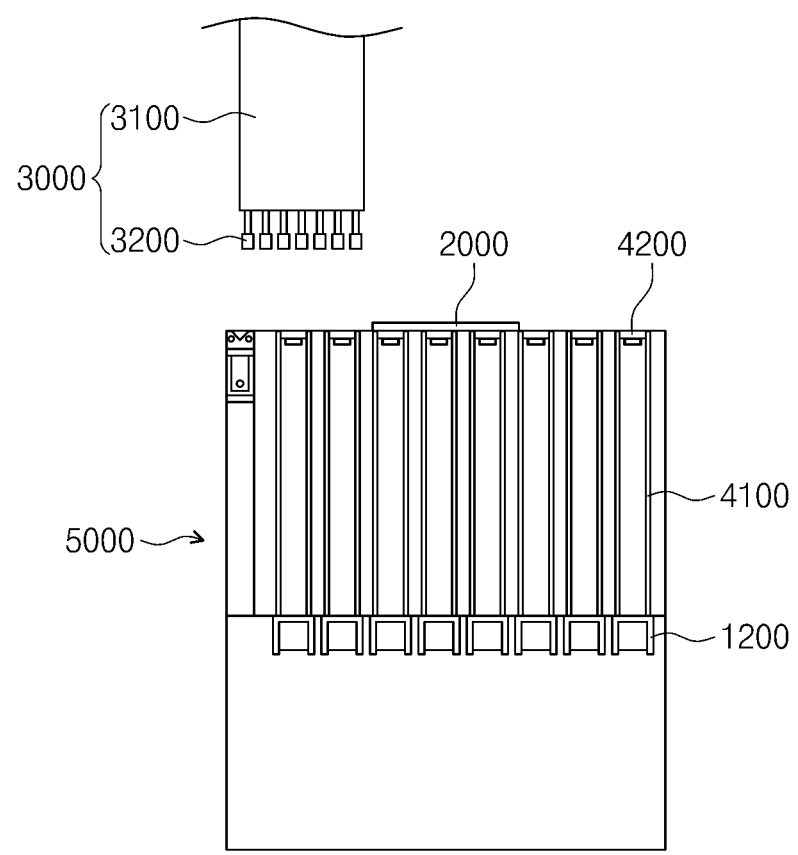
FIG. 3 is a front view of the mounting apparatus of FIG. 1, illustrating an element value measuring unit and an end portion of a feeder.
Figure 4:
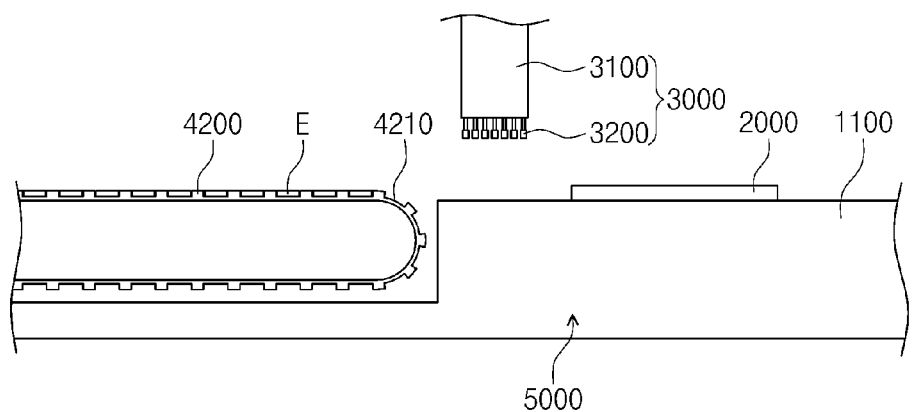
FIG. 4 is a side view illustrating the end portion of the feeder of the mounting apparatus of FIG. 1.

FIG. 3 is a front view illustrating an element value measuring unit and an end portion of a feeder of the mounting apparatus of FIG. 1, and FIG. 4 is a side view illustrating the end portion of the feeder of the mounting apparatus of FIG. 1.

Referring to FIGS. 1 to 4, the feeder 4000 may be disposed adjacent to a side surface of the table 1100. In the embodiment shown in FIGS. 1 to 4, the feeder 4000 is shown disposed adjacent the side surface of the table 1100 in the first direction X. The position of the feeder 4000 is not limited thereto, however, and the feeder 4000 may, for example, also be disposed adjacent to a side surface of the table 1100 in the second direction Y. The feeder 4000 may be detachably or removeably disposed on the feeder mount unit 1200. The feeder 4000 may be configured to supply the element E that is to be attached to the substrate. A plurality of feeders 4000 may be provided. Elements E that are supplied by different ones of the feeders 4000 may be different from each other.

The feeder 4000 may include a reel 4100 and a tape 4200.

The reel 4100 may be rotatably coupled to the feeder mount unit 1200. For example, when the feeder 4000 is disposed adjacent to the side surface of the table 1100 in the first direction X, the reel 4100 may be rotatably provided around an axis where a longitudinal direction of the reel 4100 extends in the second direction Y. The reel 4100 may have a substantially cylindrical shape. The tape 4200 may be wound around an outer circumferential surface of the reel 4100. The tape 4200 can move toward the table 1100 as the reel 4100 rotates. The elements E to be supplied to the table 1100 may be disposed on a top surface of the tape 4200. For example, transfer holes 4210 corresponding to the shape of the element E may be defined in the tape 4200. A separate element E may be disposed in each of the transfer holes 4210, respectively. Thus, each of the elements E may be transferred to the table 1100 in a state where each of the elements E are directed to predetermined positions of the table 1100. In operation, the portion of the tape 4200 supplied toward the table 1100 may then be rotated downward and returned toward the reel 4100.

The head unit 3000 may be disposed above the table 1100. The head unit 3000 picks up an element E from the tape 4200 and then attaches the element E to the substrate. The head unit 3000 may include a head 3100 and a picker 3200. The head 3100 may be movably provided in the first, second, and third directions X, Y, and Z, respectively. Thus, the head 3100 may move between the tape 4200 and the support member 2000, between the tape 4200 and the element value measuring unit 5000, and between the element value measuring unit 5000 and the support member 2000. The picker 3200 may be disposed on an outer surface of the head 3100. For example, the picker 3200 may be disposed on a bottom surface or a side surface of the head 3100. One or more pickers 3200 may be disposed on the head 3100. During operation, the picker 3200 picks up the element E from the tape 4200. For example, the picker 3200 may pick up the element E using a vacuum-adsorption technique.

The element value measuring unit 5000 may also be disposed adjacent to a side surface of the table 1100. For example, the element value measuring unit 5000 may be disposed adjacent to one or more side surfaces of the feeders 4000 in the second direction Y. However, a position of the element measuring unit 5000 is not limited thereto, and the element measuring unit 5000 may be disposed at any desired location on the mounting apparatus 10, such as adjacent one side surface of the table 1100 in the first or second direction X or Y, respectively, near which the feeder 4000 is disposed, or it may be disposed adjacent a side surface of the table 1100 that is opposite to the side surface adjacent to which the feeder 4000 is disposed.

The element value measuring unit 5000 may test the performance characteristics of an element E supplied from the feeder 4000. The element value measuring unit 5000 may include a case 5100 and a measuring member 5200. The case 5100 may form an outer structure for protecting and supporting the element value measuring unit 5000. The case 5100 may be fixed to the frame 1000 in a position adjacent to the table 1100. The measuring member 5200 may be disposed at a side of the case 5100 and may be disposed adjacent to the table 1100. For example, the measuring member 5200 may be disposed above the case 5100 in a direction adjacent to the table 1100. The element E may be input into the measuring member 5200 and then tested.

The elements E used to manufacture the semiconductor device may be different in type and value. Thus, an appropriate feeder 4000 should be coupled to the feeder mount unit 1200 after an element E, suitable to a design of the particular semiconductor device, is selected. If the element E supplied by the feeder 4000 differs in type or value from the design criteria of the semiconductor device, it may cause a defect in the semiconductor device.

In addition, the elements E supplied from each of the feeders 4000 disposed on the feeder mount unit 1200 may be positioned differently from each other on the substrate. The elements E supplied from each of the feeders 4000 may further be different in type and value. Thus, each of the feeders 4000 needs to be mounted on an appropriate predetermined position of the feeder mount unit 1200. If the feeder 4000 is mounted at an incorrect position, the element E may be coupled to the wrong position of the substrate, resulting in failures in the semiconductor device.

Figure 5:
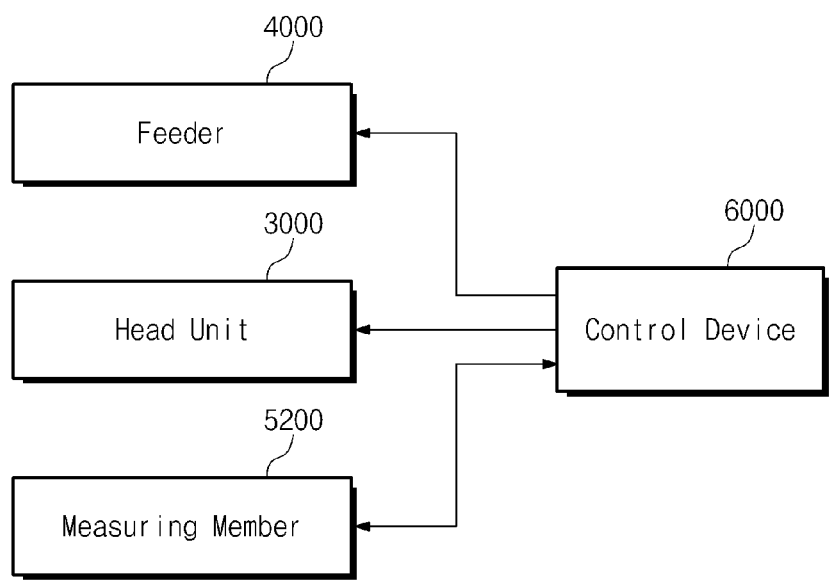
FIG. 5 is a block diagram illustrating features of a mounting apparatus according to an embodiment of the inventive concepts.

FIG. 5 is a block diagram illustrating features of the mounting apparatus according to an embodiment of the inventive concepts.

Referring to FIGS. 1 to 5, a control device 6000 may control one or more components of the mounting apparatus 10.

For instance, the control unit 6000 may control an operation of the feeder 4000. When the feeder 4000 is mounted on the feeder mount unit 1200, the control device 6000 may control a start of rotation of the reel 4100, as well as a rotation speed of the reel 4100. When the reel 4100 rotates, an element E disposed in a transfer hole 4210 of the tape 4200 is transferred toward the support member 2000. Alternatively, a user may manually control the start of the rotation of the reel 4100 and/or the rotation speed of the reel 4100.

The control device 6000 may additionally or alternatively control an operation of the head unit 3000. The control device 6000 may store design information regarding the semiconductor device which will be produced in the mounting apparatus 10. The design information may include information regarding the types and values of the elements E, and positions of the substrate to which the respective elements E are to be attached. Also, the control device 6000 may store information indicating which feeder 4000 among the plurality of feeders 4000 a specific element E is to be supplied through. The control device 6000 may control the head unit 3000 to attach each of the elements E, supplied from corresponding ones of the reels 4100, to its predetermined position on the substrate based on the design information.

Figure 6:
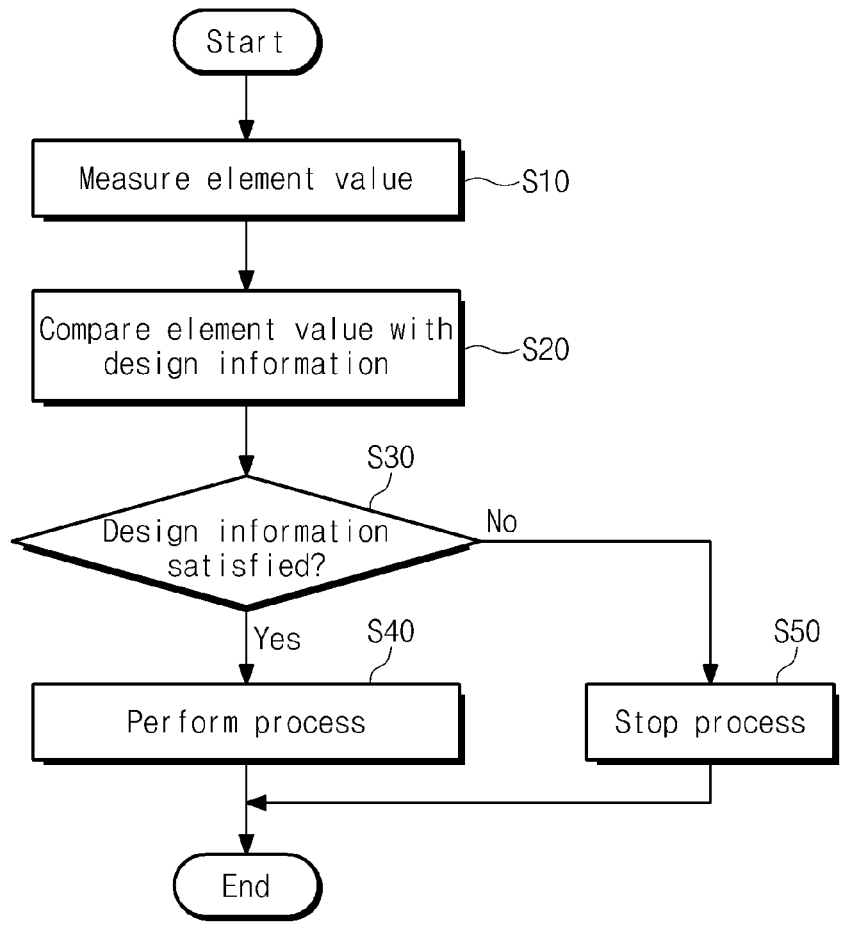
FIG. 6 is a flowchart illustrating a process of testing an element value according to an aspect of the inventive concepts.

FIG. 6 is a flowchart illustrating a process of testing an element value.

Referring to FIGS. 1 to 6, the element E supplied to the feeder 4000 is tested in the element value measuring unit 5000 to determine whether the feeder 4000 mounted on the feeder mount unit 1200 is supplying elements E that are suitable for the design of the semiconductor device.

In a first step S10, when a new feeder 4000 is mounted on the feeder mount unit 1200, the element value measuring unit 5000 measures the value of the element E supplied from the feeder 4000. More specifically, when a new feeder 4000 is mounted on the feeder mount unit 1200, the control device 6000 controls the head unit 3000 to pick up and move the element E from the feeder 4000 to the element value measuring unit 5000. The control device 6000 may automatically detect when a new feeder 4000 is mounted on the feeder mount unit 1200. For example, a sensor may be provided on the feeder mount unit 1200 to allow the control device 6000 to detect when a new feeder 4000 is mounted on the feeder mount unit 1200 using a signal received from the sensor. Alternatively, when a new feeder 4000 is mounted on the feeder mount unit 1200, a user may directly input an appropriate instruction into the control device 6000. When the element E is supplied to the element value measuring unit 5000, the control device 6000 may control the element value measuring unit 5000 to measure the value of the element E.

In a subsequent step S20, the element value measured in the element value measuring unit 5000 can be compared to the predetermined design information. More particularly, the element value measured in the element value measuring unit 5000 may be transmitted to the control device 6000, and the control device 6000 can compare the received element value with the stored design information. As described above, the design information can include information regarding the types and values of the elements E supplied from each of the feeders 4000. The control device 6000 may further store information indicating through which of the plurality of feeders 4000 the element E to be tested is being supplied, or information regarding a position of a newly mounted feeder 4000. Thereafter, when the measured element value is received, the control device can compare the received element value with the design information associated with the feeder 4000 that provided the tested element E.

By comparing the element value with the design information, the control device 6000 can determine if the design conditions contained in the design information have been satisfied in a step S30. If the element E satisfies the design conditions, the control device 6000 may control the feeder 4000 and the head unit 3000 to perform a process of manufacturing the semiconductor device in a further step S40. However, when the element E does not satisfy the design conditions, the control device 6000 may stop the process of manufacturing the semiconductor device in an alternative step S50. A range for stopping the manufacturing process may be set as desired. For example, when the element value does not satisfy the design conditions, the manufacturing process may be completely stopped, if desired. Alternatively, when the element value does not satisfy the design conditions, the manufacturing process may be only partially stopped, if desired. More particularly, when the elements E supplied from some of the plurality of feeders 4000 do not satisfy the design conditions, the manufacturing process may continue to be performed using the rest of the feeders 4000, which supply elements E having values that satisfy the design conditions.

Whether or not the element value satisfies the design conditions may be determined with respect to an error range. An error may occur during a process of manufacturing the element E. Also, the performance characteristics of the element E may vary due to environmental factors, such as a temperature at which the element value is measured. Thus, even when the element E supplied from the feeder 4000 matches the design conditions, there may be a difference between the measured element value and the design conditions. Therefore, the control device 6000 may consider an acceptable error range, taking into account all of the desired factors, when comparing the measured element value with the design conditions. Then, when the element value falls within the acceptable error range based on the design conditions and desired factors, the control device 6000 may determine that the element value satisfies the design conditions. The error range may, for example, be adjusted by a user.

A feeder 4000 supplying elements E that do not satisfy the design conditions may be replaced while the manufacturing process is stopped. Afterwards, when the control device 6000 recognizes that a new feeder 4000 is mounted on the feeder mount unit 1200, the control device 6000 may repeat the process of measuring the value of the element E supplied from the new feeder 4000.

Figure 7:
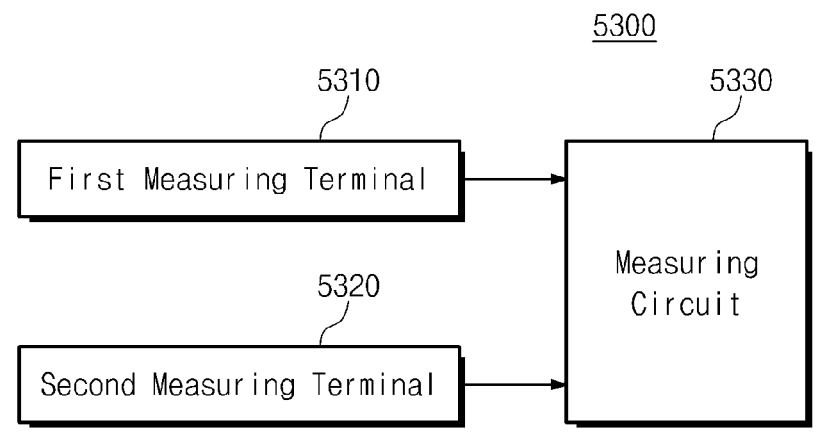
FIG. 7 is a block diagram illustrating features of a measuring member according to another embodiment of the inventive concepts.

FIG. 7 is a block diagram illustrating features of a measuring member according to another embodiment of the inventive concepts.

Referring to FIG. 7, a measuring member 5300 may include measuring terminals 5310 and 5320 and a measuring circuit 5330.

An element E measured in the measuring member 5300 may, for instance, be a passive element E. The passive element E may include two terminals. The passive element E may, however, be arranged without regard to an arrangement direction of each of the terminals. Thus, the measuring member 5200 may include first and second measuring members 5310 and 5320, respectively, each in contact with a corresponding one of the terminals.

The measuring member 5300 may be electrically connected to the measuring terminals 5310 and 5320. The measuring member 5300 may measure a type and value of the element E using a signal received from the measuring terminals 5310 and 5320. For example, the measuring member 5300 may include a power source configured to apply a current or voltage to the element E in contact with the measuring terminals 5310 and 5320. The measuring member 5300 may further include a circuit for measuring the type and value of the element E using a current or voltage received back from the measuring terminals 5310 and 5320. Here, a power applied from the measuring member 5300 to the element E may be a direct current (DC) or an alternating current (AC) power. Thus, the measuring member 5300 may measure the type and value of the element E, regardless of whether the element E is a resistor, an inductor, or a capacitor, for instance, by using the intensity of the signal received from the measuring terminals 5310 and 5320, along with a phase difference between the applied power and the received signal.

Figure 8:
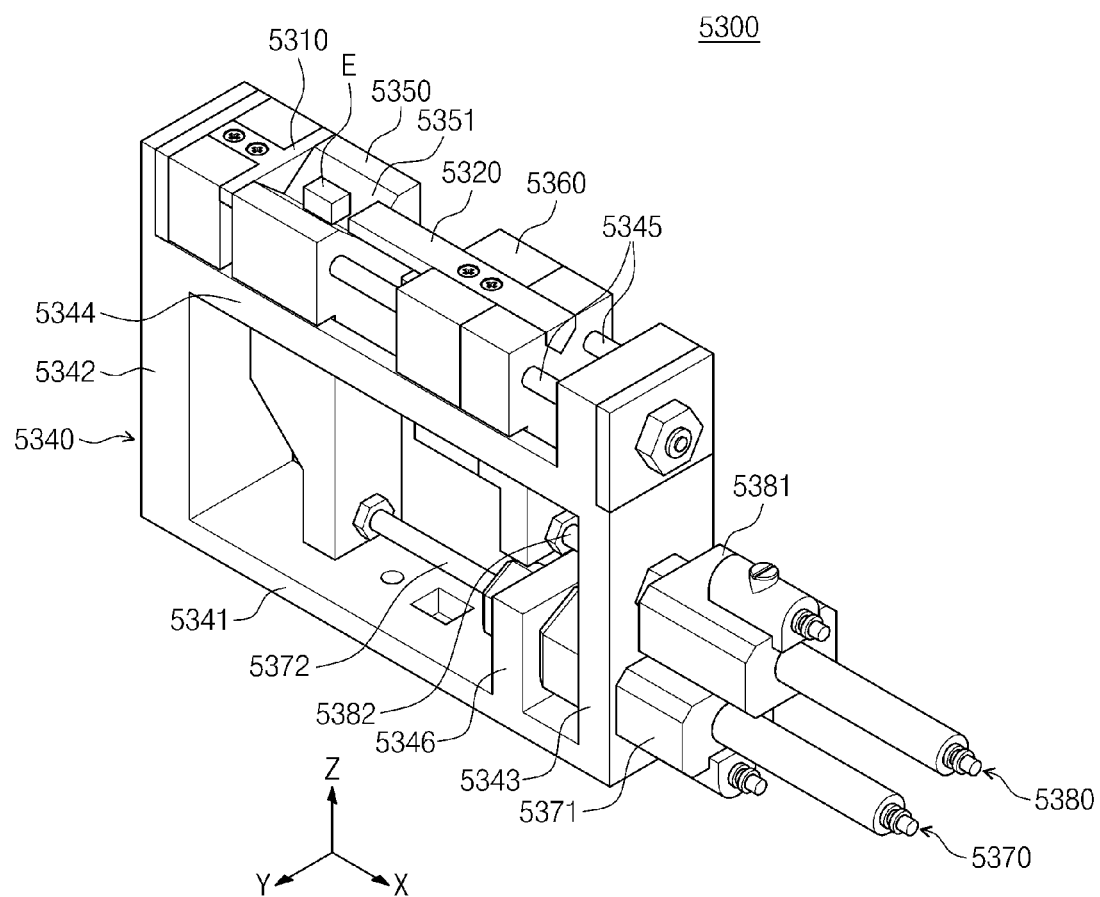
FIG. 8 is a perspective view illustrating a measuring member in a state where an element is disposed on the measuring member.

FIG. 8 is a perspective view illustrating a measuring member 5300, such as that depicted schematically in block diagram form in FIG. 7, in a state where an element E is disposed on the measuring member 5300.

Referring to FIG. 8, the measuring member 5300 may include a body 5340, an element support 5350, and a terminal driver 5360.

The body 5340 provides a frame for the measuring member 5300. The body 5340 may, for example, be fixed to the case 5100 of the element value measuring unit 5000 (see FIG. 1). The body 5340 may include a support 5341, a first protrusion 5342, and a second protrusion 5343.

The support 5341 may have a substantially plate-like shape having a predetermined length in the first direction X and width in the second direction Y. The support 5341 forms a lower portion of the body 5340. The first and second protrusions 5342 and 5343, respectively, protrude away from a top surface of the support 5341 in a third direction Z. The first and second protrusions 5342 and 5343, respectively, may be disposed at opposite ends of the support 5341 in the first direction X. The first and second protrusions 5342 and 5343, respectively, may therefore be spaced apart from each other in the first direction X. The first protrusion 5342 may be disposed closer to the table 1100 (see FIG. 1) than the second protrusion 5343. A reinforcement member 5346 may be disposed between the first and second protrusions 5342 and 5343, respectively, on the top surface of the support 5341. The reinforcement member 5346 may have a length shorter than those of the first and second protrusions 5342 and 5343, respectively. The reinforcement member 5346 may be disposed closer to the second protrusion 5343 than the first protrusion 5342.

A rail 5344 and a shaft 5345 may be disposed between the first and second protrusions 5342 and 5343, respectively. The rail 5344 and the shaft 5345 may be disposed between the first and second protrusions 5342 and 5343, respectively, so as to connect facing surfaces of the first and second protrusions 5342 and 5343, respectively. The rail 5344 and the shaft 5345 may be spaced apart from each other above the top surface of the support 5341 in the third direction Z. The shaft 5345 may be disposed above the rail 5344. A plurality of rails 5344 may be provided. The plurality of rails 5344 may be spaced apart from each other in the second direction Y. A plurality of shafts 5345 may also be provided. The plurality of shafts 5345 may also be spaced apart from each other in the second direction Y.

The first measuring terminal 5310 may be electrically connected to one of the terminals of the element E, and may be disposed on an inner side of the first protrusion 5342, or on an inner side of the second protrusion 5343, for example. The first measuring terminal 5310 may be disposed above the rail 5344.

An element support 5350 can support the element E being measured. The element support 5350 can be disposed on the rail 5344 such that it is moveable in the first direction X. For example, the element support 5350 may be stepped, or have protruding side portions, so that both sides of the element support 5350 are supported by the rails 5344 in the second direction Y. Thus, an upper portion of the element E may be disposed above the rail 5344, and a lower portion of the element support 5350 may be disposed below the rail 5344. A hole may be defined in or through the element support 5350 to allow the shaft 5345 to be inserted thereinto.

An element support groove 5351 may be defined in an upper portion of the element support 5350. The head unit 3000 (see FIG. 4) may be used to position the element E to be tested (i.e., whose type and/or value is to be measured) in the element support groove 5351. Opposing sidewalls of the element support groove 5351 may extend upwardly at a slant toward corresponding sides of the element support 5350. A longitudinal direction of the element support groove 5351 may be defined along the first direction X. The element support groove 5351 may be a groove having a V-shaped cross-section perpendicular to its longitudinal direction. The element E that is to be measured may, for instance, have a cube or box-like structure. When the element support groove 5351 has a V shape, opposing sides of the element support groove 5351 may support sides of the element E so as to align the element E in the first direction X.

The terminal driver 5360 may be disposed on the rail 5344 such that it is moveable along the first direction X. For example, the terminal driver 5360 may be stepped, or have protruding side portions, along opposing sidewalls in the second direction Y, so that both sides of the terminal driver 5360 may be supported by the rail 5344. Thus, an upper portion of the terminal driver 5360 may be disposed above the top surface of the rail 5344, and a lower portion of the terminal driver 5360 may be disposed below the rail 5344. One or more holes may be defined in the terminal driver 5360 to allow the shaft(s) 5345 to be inserted thereinto. The terminal driver 5360 may, for example, be disposed between the element support 5350 and the first protrusion 5342, or between the element support 5350 and the second protrusion 5343. More particularly, the terminal driver 5360 may be disposed in a direction facing the element support 5350 and the first measuring terminal 5310. Thus, when the first measuring terminal 5310 is disposed on the first protrusion 5342, the terminal driver 5360 may be disposed between the element support 5350 and the second protrusion 5343. Alternatively, when the first measuring terminal is disposed on the second protrusion 5343, the terminal driver 5360 may be disposed between the element support 5350 and the first protrusion 5342. Hereinafter, a more detailed description will be provided of an embodiment in which the first measuring terminal 5310 is disposed on the first protrusion 5342 and the terminal driver 5360 is disposed between the element support 5350 and the second protrusion 5343.

The second measuring terminal 5320 may be disposed in the terminal driver 5360. The second measuring terminal 5320 may, for example, extend toward the element support 5350 from a surface of the terminal driver 5360 facing the element support 5350. The second measuring terminal 5320 may have a height that is the same as those of the first measuring terminal 5310 and the element support groove 5351.

A lower portion of the element support 5350 may be connected to a first driver 5370, and a lower portion of the terminal driver 5360 may be connected to a second driver 5380. The first and second drivers 5370 and 5380, respectively, each move a corresponding one of the element support 5350 and the terminal driver 5360 in the first direction X. A lower end of the element support 5350 may be disposed below a lower end of the terminal driver 5360. The first driver 5370 may also be disposed below the second driver 5380 to be connected to the lower portion of the element support 5350. The first driver 5370 may extend through a hole defined in the reinforcement member 5346, and the reinforcement member 5346 may thereby further support the first driver 5370. The first and second drivers 5370 and 5380 may be attached to the second protrusion 5343.

The first driver 5370 may include a first driving part 5371 and a first rod 5372. The first driving part 5371 may be fixed to the second protrusion 5343. One end of the first rod 5372 may be movably coupled to the first driver 5371 in the first direction X. An opposite end of the first rod 5372 may be coupled to the element support 5350. For example, the first driver 5370 may vary a length of the first rod 5372 extending from the first driving part 5371 based on an amount of fluid supplied to the first driving part 5371. The first driving part 5371 may have a cylindrical structure. Alternatively, the first driver 5370 may have a structure including a linear motor or other motor. When the first driver 5370 includes a non-linear motor, the first driver 5370 may include a structure such as a gear or a cam that is capable of changing a circular movement of a motor shaft into a linear movement of a portion of the first driver 5370 to which the first rod 5373 is connected. A movement of the first driver 5370 may be controlled by the control device 6000. When the first driving part 5371 has a cylinder structure, the control device 6000 may control the amount and rate of fluid supplied to the first driving part 5371. When the first driving part 5371 includes a linear motor or a motor, the control device 6000 may control the intensity, frequency, or phase of a voltage or a current supplied to the first driving part 5371.

The second driver 5380 may include a second driving part 5381 and a second rod 5382. The second driving part 5381 may also be attached to the second protrusion 5343. One end of the second rod 5382 may be coupled to the second driver 5381 such that it is capable of movement in the first direction X. The other end of the second rod 5382 may be coupled to the element driver 5360. For example, similar to the first driver 5370, the second driver 5380 may vary a length of the second rod 5382 extending from the second driving part 5381 based on a supply of fluid provided to the driving part 5381. In this case, the second driving part 5381 may include a cylindrical structure. Alternatively, the second driver 5380 may include a linear motor or other motor. When the second driver 5380 includes a non-linear motor, the second driver 5380 may include a structure such as a gear or a cam that is capable of converting a circular movement of the motor shaft into a linear movement of a portion of the second driver 5380 to which the second rod 5383 is connected. Operation of the second driver 5380 may be controlled by the control device 6000. More particularly, when the second driving part 5381 has a cylinder structure, the control device 6000 may control the amount and rate of fluid supplied to the second driving part 5381. When the second driving part 5381 includes a linear or other motor, the control device 6000 may control the intensity, frequency, or phase of a voltage or a current supplied to the second driving part 5381.

The reinforcement member 5346 may be omitted from the above-described structure. Furthermore, either or both of the rails 5344 and/or the shafts 5345 may be omitted from the above-described structure.

Figure 9:
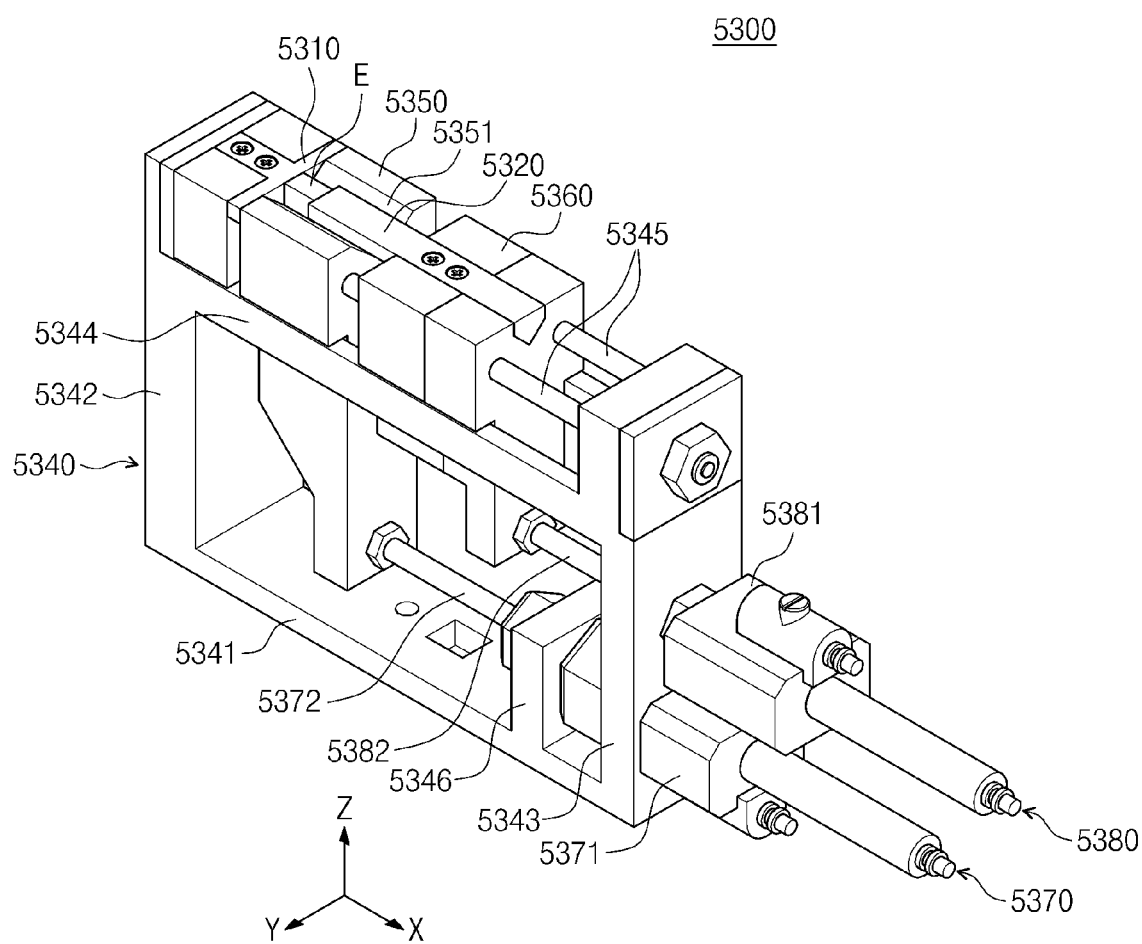
FIG. 9 is a perspective view illustrating the measuring member of FIG. 8 in a state where the element is measured in the measuring member.
Figure 10:
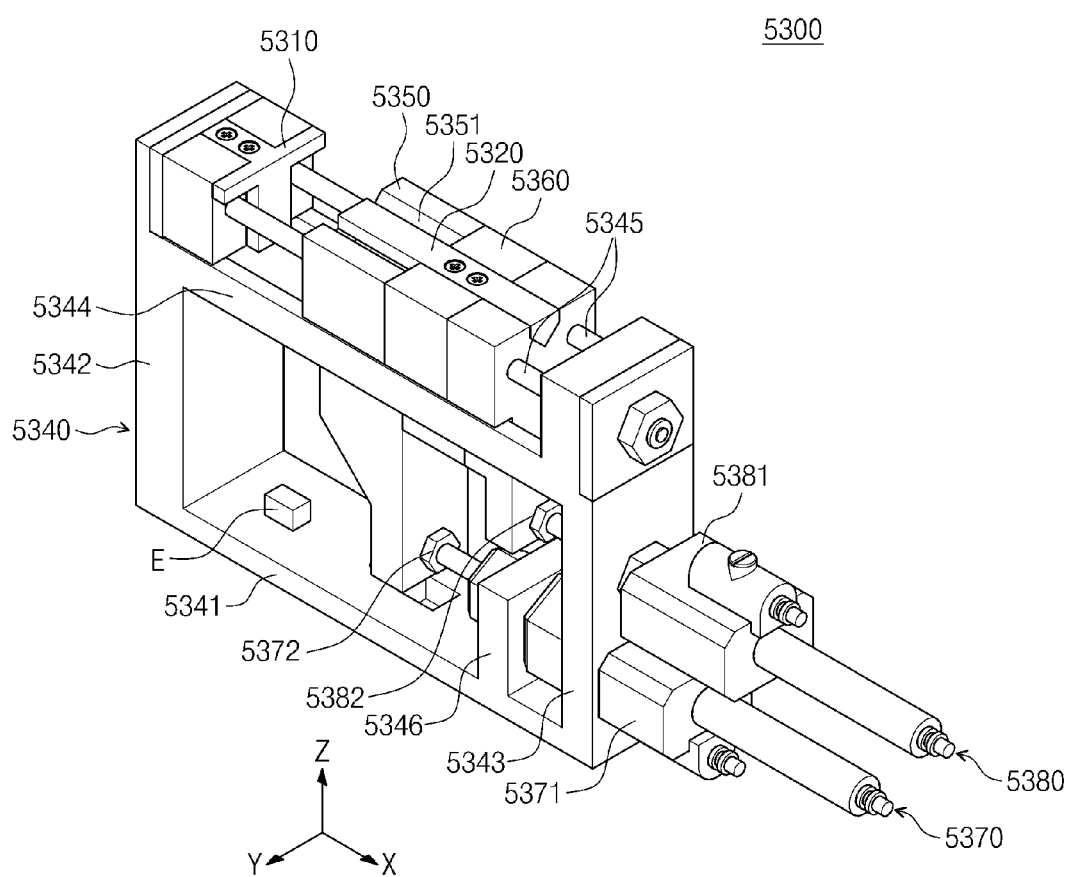
FIG. 10 is a perspective view illustrating the measuring member of FIG. 8 in a state where the element is removed from an element support.

FIG. 9 is a perspective view illustrating the measuring member 5300 of FIG. 8, in a state where the element E is being measured in the measuring member 5300. FIG. 10 is a perspective view of the measuring member of FIG. 8, illustrating a state where the element E is removed from an element support 5350.

Referring now to FIGS. 8 to 10, a process of measuring the value of the element E using the measuring member 5300 will be described below.

The measuring member 5300 may be in a standby mode when the element E is input to the measuring member 5300 by the head unit 3000. An upper portion of the element support groove 5351 may be maintained in an opened state during the standby mode. More particularly, during the standby mode, the terminal driver 5360 may be spaced apart from the element support 5350 so that the second measuring terminal 5320 is disposed outside the element support groove 5351. Also, a surface of the element support 5350 may be in contact with the first measuring terminal 5310, or may otherwise be disposed adjacent to the first measuring terminal 5310. When the element support 5350 is spaced apart from the first measuring terminal, a gap between the element support 5350 and the first measuring terminal 5310 may be shorter than a length of the element E.

When the element E is inserted into the element support groove 5351, the measuring member 5300 may operate in a measuring mode. After the element E is inserted to the element support groove 5351, the terminal driver 5360 moves towards the first measuring terminal 5310. The terminal driver 5360 continues to move until the terminals of the element E contact respective ones of the first and second measuring terminals 5310 and 5320, respectively. While the terminal driver 5360 is moving, the element support 5350 may also move towards the first measuring terminal 5310, or its position may be maintained. When a first end of the element E contacts the first measuring terminal 5310 and a second end of the element E contacts the second measuring terminal 5320, a measuring circuit 5330 provided in the measuring member 5300 measures the element value.

When testing the element E is completed, the measuring member 5300 can operate in a discharge mode. In the discharge mode, the element E may be discharged from the element support 5350 through a space defined between the first measuring terminal 5310 and the element support 5350. More particularly, during the discharge mode, the element support 5350 and the terminal driver 5360 move in a direction away from the first measuring terminal 5310. The element support 5350 moves until a distance between the first measuring terminal 5310 and the element support 5350 becomes larger than the length of the element E. Alternatively, the element support 5350 may move a distance longer than that of the terminal driver 5360. Thus, the second measuring terminal 5320 may push the element E out of the first measuring terminal 5310, thereby removing the element E from the element support groove 5351. Once the element E is completely removed, the measuring member 5300 enters the standby mode again to wait for input of a new element E.

Figure 11:
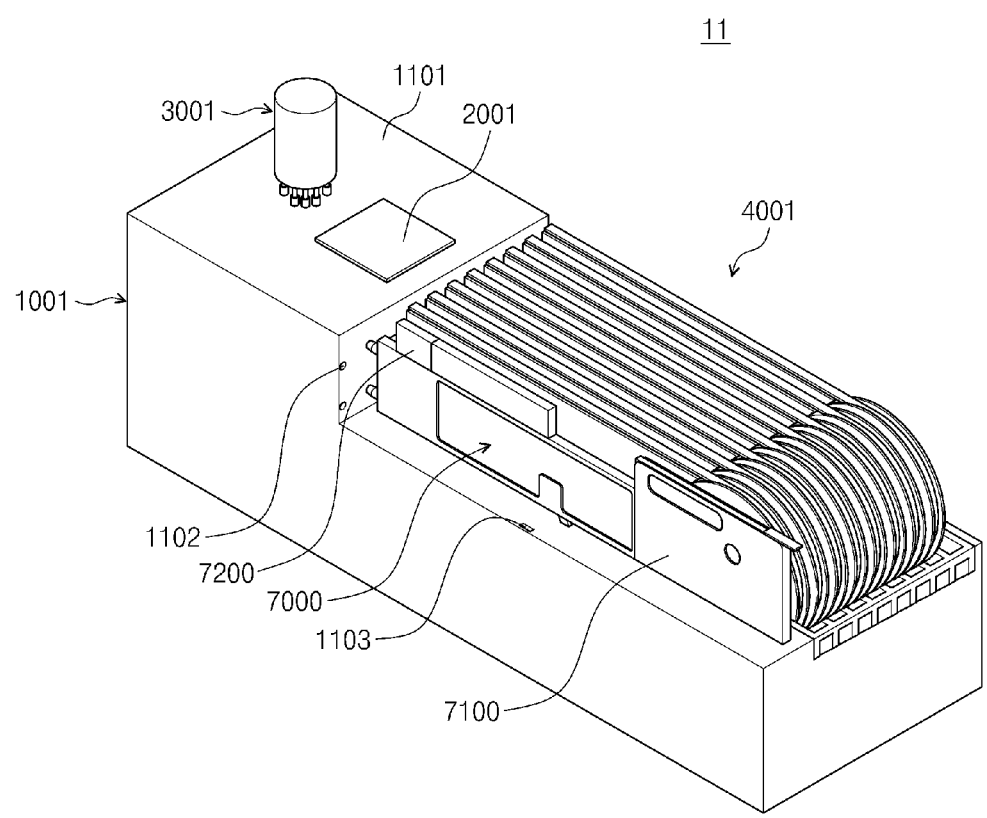
FIG. 11 is a perspective view of a mounting apparatus according to another embodiment of the inventive concepts, in which the element value measuring unit may be separated from the rest of the mounting apparatus.
Figure 12:
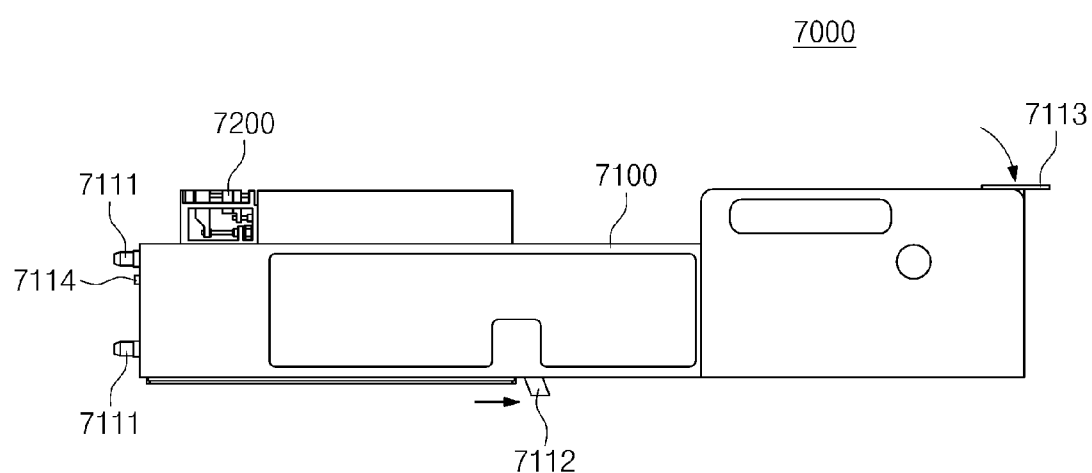
FIG. 12 is a side view illustrating the element value measuring unit of the mounting apparatus of FIG. 11.

FIG. 11 is a perspective view illustrating a mounting apparatus 11 according to another embodiment of the inventive concepts, in which the element value measuring unit 7000 may be separated from the mounting apparatus 11. FIG. 12 is a side view illustrating the element value measuring unit 7000 of FIG. 11.

In the embodiment shown in FIGS. 11 and 12, since a support member 2001, a head unit 3001, and a feeder 4001 included in a mounting apparatus 11 are essentially the same as the support member 2000, head unit 3000, and feeder 4000 of the mounting apparatus 10 in FIG. 1, redundant descriptions thereof will be omitted herein.

Referring to FIGS. 11 and 12, an element value measuring unit 7000 may be detachably or removeably disposed on a frame 1001.

One or more shafts, pins, or alignment members 7111 or 7112 for fixing the element value measuring unit 7000 to the frame 1001 may be disposed on a case 7100 of the element value measuring unit 7000. For example, one or more insertion shafts 7111 and a rotation shaft 7112 may be disposed on the case 7100. The one or more insertion shafts 7111 may protrude from an outer surface of the case 7100 so as to be located adjacent to a table 1101. The one or more insertion shafts 7111 may be inserted into a corresponding insertion hole 1102 defined in the frame 1001. A sensor 7114 may be disposed on the outer surface of the case 7100 to detect whether the insertion shaft(s) 7111 is properly inserted into the corresponding insertion hole 1102.

The rotation shaft 7112 may be disposed on the bottom surface of the case 7100. A support hole 1103 may be defined in the frame 1001 at a position corresponding to the rotation shaft 7112, such that the rotation shaft 7112 may be inserted into the support hole 1103. The rotation shaft 7112 may be rotatably disposed such that a lever 7113 disposed at one side of the case 7100 may be used to rotate the rotation shaft 7112. Accordingly, after the rotation shaft 7112 is inserted into the support hole 1103, a user may use the lever 7113 to rotate the rotation shaft 7112 such that it is arranged at a slant with respect to a direction perpendicular to the bottom surface of the case 7100. The rotation shaft 7112 may thereby prevent the case 7100 from being moved in a direction away from the table 1101.

Alternatively, one or more of the insertion and rotation shafts 7111 and 7112, respectively, may be omitted from the case 7100.

Figure 13:
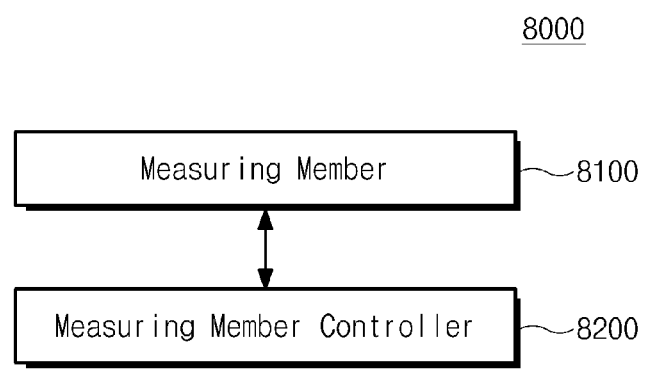
FIG. 13 is a block diagram illustrating features of an element value measuring unit according to another embodiment of the inventive concepts.

FIG. 13 is a block diagram illustrating features of an element value measuring unit 8000 according to another embodiment of the inventive concepts.

Referring to FIG. 13, an element value measuring unit 8000 may include a measuring member controller 8200 in addition to a measuring member 8100.

The measuring member controller 8200 may receive design information from the control device 6000 (see FIG. 5). The control device 6000 may, for instance, transmit design information including design values and/or design conditions for the element E being measured in a measuring member 8100 to the measuring member controller 8200. Also, the measuring member 8100 may transmit an element value of the measured element E to the measuring member controller 8200. The measuring member controller 8200 may compare the design information with the measured element value, and then transmit the resultant value to the control device 6000. Since a specific order of testing the element value may be substantially the same as that of the process described with respect to FIG. 6, a redundant description thereof will be omitted herein.

Figure 14:
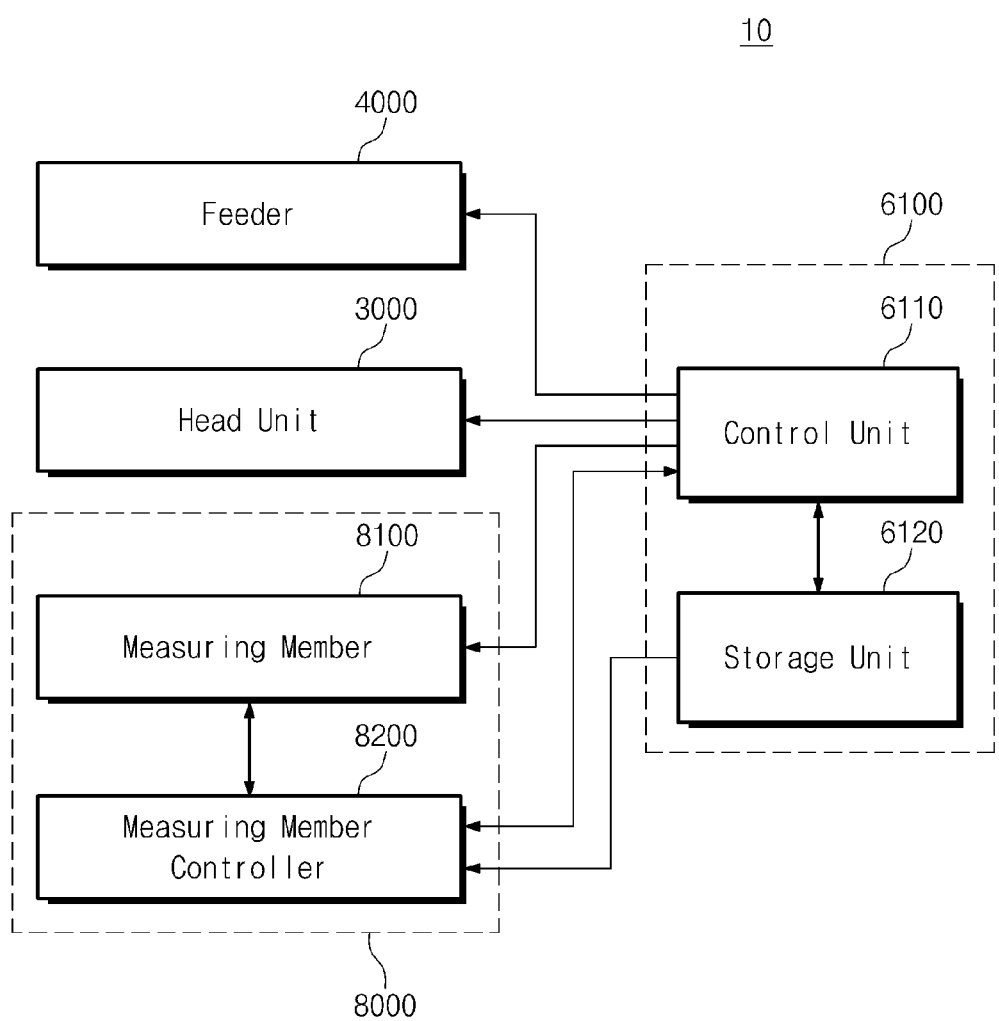
FIG. 14 is a block diagram illustrating features of a mounting apparatus including a control device according to another embodiment.

FIG. 14 is a block diagram illustrating features of a mounting apparatus 10 including a control device 6100 according to another embodiment.

Referring to FIG. 14, a control device 6100 may include a storage unit 6120 and a control unit 6110.

The storage unit 6120 may store design information regarding the semiconductor device. The storage unit 6120 may, for example, be disposed on an inner or outer surface of the frames 1000 and 1001 of the mounting apparatuses 10 and 11. Alternatively, the storage unit 6120 may be arranged away from the frames 1000 and 1001. For example, the storage unit 6120 may be a data storage medium capable of transceiving data with the control unit 6110 in wired or wireless manner. The storage unit 6120 may directly transmit design information regarding the element E to the measuring member controller 8200, or may transmit design information through the control unit 6110.

The measuring member controller 8200 may compare the design information received from the control device 6100 with the element value measured in the measuring member 8100. The measuring member controller 8200 may transmit the result of this comparison to the control unit 6110. The control unit 6110 may utilize the result received from the measuring member controller 8200 to control the feeders 4000 and 4001 and the head units 3000 and 3001. The control unit 6110 may store the result received from the measuring member controller 8200 in the storage unit 6120. For example, the control unit 6110 may store information indicating which of the plurality of mounted feeders 4000 and 4001 contain elements that differ from the design conditions, or may store information regarding the type or element value of the element E provided by incorrectly mounted feeders 4000 and 4001. These testing results may be accumulated to provide a series of test result histories. The test result histories may then be used as basic data for assisting in later mounting the feeders 4000 and 4001 without an error.

Since a method of controlling the feeders 4000 and 4001 and head units 3000 and 3001 using the control unit 6110 is essentially the same as that described previously, redundant description thereof will be omitted.

Figure 15:
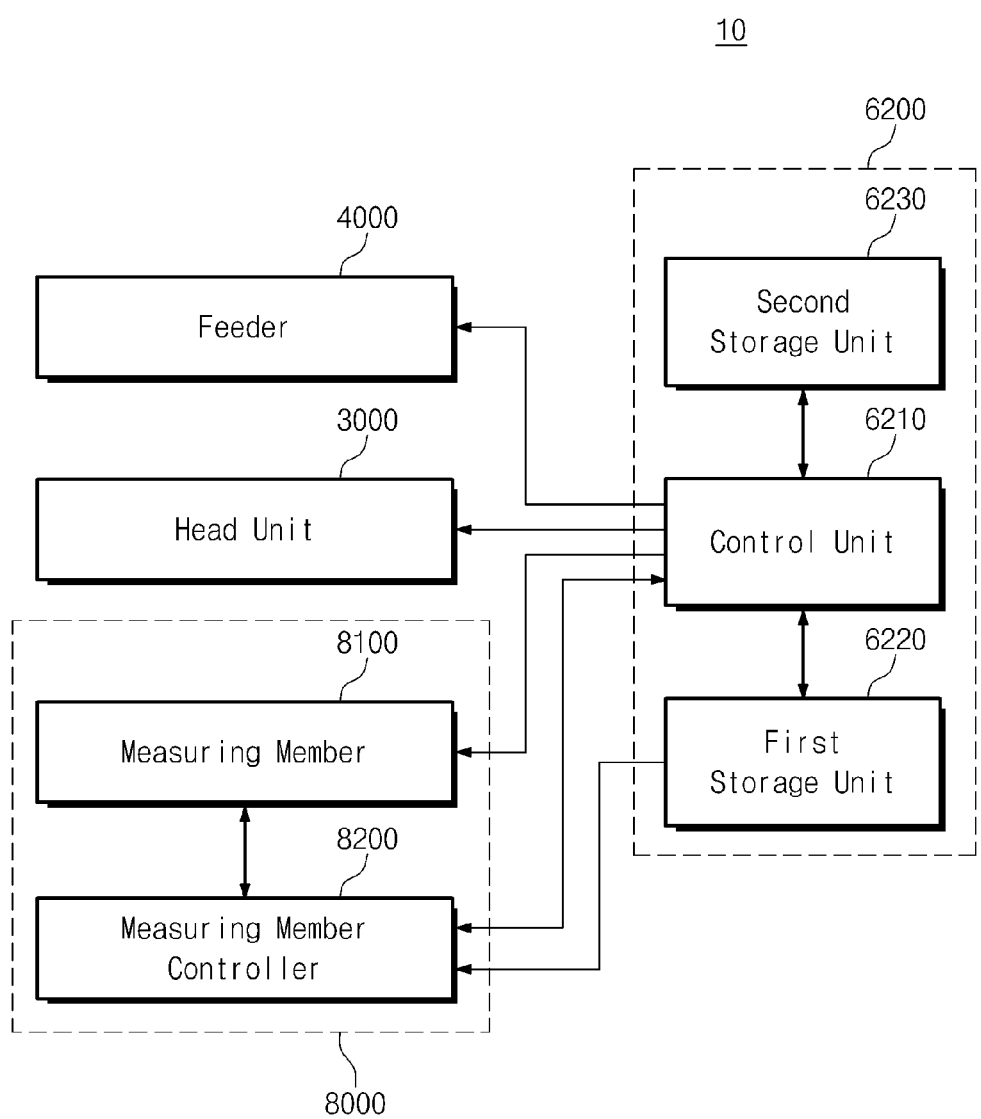
FIG. 15 is a block diagram illustrating features of a mounting apparatus including a control device according to a further embodiment.

FIG. 15 is a block diagram illustrating a mounting apparatus 10 including a control device 6200 according to a further embodiment.

Referring to FIG. 15, a control device 6200 may include a first storage unit 6220, a second storage unit 6230, and a control unit 6210.

The first storage unit 6220 may store design information with respect to the semiconductor device being manufactured. The first storage unit 6220 may be disposed on an inner or outer surface of the frames 1000 and 1001 of the mounting apparatuses 10 and 11. Alternatively, the first storage unit 6220 may be arranged separate from the frames 1000 and 1001. The first storage unit 6220 may, for example, be a data storage medium capable of transceiving data with the control unit 6210 in a wired or wireless manner. The first storage unit 6220 may directly transmit, or transmit through the control unit 6210, the design information regarding the element E to the measuring member controller 8200.

The measuring member controller 8200 may compare the design information received from the control device 6200 with the element value measured in the measuring member 8100. The measuring member controller 8200 may transmit the result of the comparison to the control unit 6210. The control unit 6210 may use the result received from the measuring member controller 8200 when controlling the feeders 4000 and 4001 and the head units 3000 and 3001.

The second storage unit 6230 may store the result received from the measuring member controller 8200. That is, the control unit 6210 may transmit the result received from the measuring member controller 8200 to the second storage unit 6230. The second storage unit 6230 may be disposed on an inner or outer surface of the frames 1000 and 1001 of the mounting apparatuses 10 and 11. Alternatively, the second storage unit 6230 may be arranged separate from the frames 1000 and 1001. The second storage unit 6230 may, for example, be a data storage medium capable of transceiving data with the control unit 6210 in a wired or wireless manner. The control unit 6210 may process the result received from the measuring member controller 8200 and transmit the processed result to the second storage unit 6230. For example, the control unit 6210 may process information indicating which of the plurality of feeders 4000 and 4001 contain elements E that are different from the design conditions, or information indicating the type and/or element value of the elements E provided by the incorrectly mounted feeders 4000 and 4001. The control unit 6210 may thereafter transmit the processed information to the second storage unit 6230. These test results may be accumulated to provide a series of test result histories. The test result histories may be used as basic data for mounting the feeders 4000 and 4001 without an error.

Since a method of controlling the feeders 4000 and 4001, the head units 3000 and 3001, and the measuring member 8100 by the control unit 6210 is essentially the same as that described previously, redundant description will be omitted.

According to embodiments of the inventive concepts, a mounting apparatus can efficiently mount an element on a substrate.

The foregoing detailed description provides example embodiments of the inventive concepts. These embodiments may, however, be used in various combinations and environments, with numerous modifications thereto possible within the scope of ordinary skill in the art. That is, the inventive concepts may be amended or modified, without departing from the scope, technical skill, or knowledge in the art. Further, the scope of the claims should not be limited to these specific embodiments or to their specific features or benefits. Rather, it is intended that the scope of the claims extend to all reasonable configurations and to their equivalents.

What is claimed is:

1. A mounting apparatus, comprising:
    a frame;
    a feeder arranged adjacent to the frame, the feeder arranged to provide an element;
    a measuring member disposed adjacent to the frame and configured to measure a value of an element, wherein the measuring member comprises
        an element support configured to receive an element and support an element while a value of an element is measured,
            wherein the element support is moveable in a direction corresponding with a longitudinal axis of the measuring member; and
        a first measuring terminal and a second measuring terminal positioned to face opposing sides of the element support, wherein the first measuring terminal and the second measuring terminal are connected to a supply of voltage or current, at least one of the first and second measuring terminals is movable in a direction approaching and away from each other; and
    wherein the measuring member is configured to supply the voltage or current to terminals of an element once the first measuring terminal and the second measuring terminal respectively contact the terminals of an element to form a circuit to measure a value of an element arranged in the measuring member.

2. The mounting apparatus of claim 1, wherein the measuring member further comprises:
    a measuring member controller; and
    wherein the measuring member controller is in electronic communication with the measuring member to compare a measured value of an element to a design criterion to determine whether or not an element is acceptable.

3. The mounting apparatus of claim 1, wherein
    at least one of the first and second measuring terminals is movable in a direction corresponding with the longitudinal axis of the measuring member.

4. The mounting apparatus of claim 1, further comprising
    a case fixed to the frame;
        wherein the measuring member comprises a body fixed to the case;
        wherein the body comprises
    a support;
    a first protrusion extending at one side of the support;
    a second protrusion extending at an opposite side of the support.

5. The mounting apparatus of claim 1, wherein the element support is movable in a direction corresponding with the longitudinal axis of the measuring member.

6. The mounting apparatus of claim 1, wherein the element support has a groove extending in a direction corresponding with the longitudinal axis of the measuring member.

7. The mounting apparatus of claim 6, wherein the groove has a substantially V-shaped cross-section when viewed perpendicular to the longitudinal axis of the measuring member.

8. The mounting apparatus of claim 4, wherein the first measuring terminal is disposed adjacent to an inner surface of the first protrusion, and
    wherein the second measuring terminal is disposed on a terminal driver arranged between the element support and the second protrusion, such that the element support is disposed between the first measuring terminal and the second measuring terminal.

9. The mounting apparatus of claim 8, wherein the terminal driver is moveable in a direction corresponding with the longitudinal axis of the measuring member.

10. The mounting apparatus of claim 9, wherein a rail extends between the first and second protrusions, wherein the terminal driver is moveably positioned on the rail but only in a direction corresponding with the longitudinal axis of the measuring member.

11. The mounting apparatus of claim 4, wherein the case and the measuring member comprise an element value measuring unit; wherein the element value measuring unit is detachably disposed on the frame.

12. The mounting apparatus of claim 11, wherein a shaft inserted into a hole defined in the frame is disposed on an outer surface of the element value measuring unit; and
    wherein a sensor is disposed on an outer surface of the element value measuring unit to detect whether the shaft is inserted into the hole.

13. The mounting apparatus of claim 2, further comprising a plurality of feeder mount units and a plurality of feeders,
    wherein each feeder mount unit is disposed in the frame,
    wherein each feeder is mounted on the feeder mount unit; and wherein the measuring member controller stores design information regarding an element provided from the feeders and a position of a substrate to which an element will be attached.

14. The mounting apparatus of claim 13, further comprising a head unit arranged adjacent to the frame to move an element from the feeder to the element support; and a
 a feeder mount unit disposed in the frame;
  wherein the feeder is mounted on the feeder mount unit; and
  wherein the feeder comprises:
   a reel; and
   a tape comprising a plurality of element receptacles, each element receptacle is configured to hold one or more elements for transfer to the head unit, wherein the reel is configured to move the element receptacles toward a support member disposed on a table that is on the frame.

15. The mounting apparatus of claim 14, further comprising a control device comprising:
 a control unit configured to control the feeder and the head unit; and
 a storage unit configured to store the design information and transmit the design information to the measuring member controller.

16. A mounting apparatus comprising:
 a frame;
 a feeder arranged adjacent to the frame, the feeder arranged to provide an element;
 a measuring member disposed adjacent to the frame and configured to measure a value of an element supplied by the feeder, wherein the measuring member comprises
  a body connected to the frame and comprising a first protrusion and a second protrusion with a support extending between the first protrusion and the second protrusion;
  an element support configured to receive an element and support an element while a value of an element is measured;
  wherein the element support is positioned between the first protrusion and the second protrusion along a longitudinal axis of the measuring member; and
  a first measuring terminal and a second measuring terminal positioned to face opposing sides of the element support, wherein the first measuring terminal and the second measuring terminal are connected to a supply of voltage or current; and
  wherein the measuring member is configured to supply the voltage or current to terminals of an element once the first measuring terminal and the second measuring terminal respectively contact the terminals of an element to form a circuit to measure a value of an element arranged in the measuring member; and
 a measuring member controller in electronic communication with the measuring member to compare a measured value of an element to a design criterion to determine whether or not an element is acceptable.

17. The mounting apparatus of claim 16, wherein at least one of the first and second measuring terminals is moveable but only in a direction corresponding with the longitudinal axis of the measuring member.

18. The mounting apparatus of claim 16,
 wherein the first measuring terminal is disposed adjacent to an inner surface of the first protrusion, and
 wherein the second measuring terminal is disposed on a terminal driver arranged between the element support and the second protrusion in a configuration such that the second measuring terminal is moveable but only in a direction corresponding with the longitudinal axis of the measuring member.

19. The mounting apparatus of claim 18, wherein the measuring member further comprises:
 a rail extending between the first protrusion and the second protrusion;
 wherein the element support and the terminal driver are moveably positioned on the rail but only in a direction corresponding with the longitudinal axis of the measuring member to cause the first and second measuring terminals of the measuring member to contact terminals of the element to be measured.

* * * * *